United States Patent
Arima

(10) Patent No.: US 7,092,923 B2
(45) Date of Patent: Aug. 15, 2006

(54) SYNAPSE ELEMENT WITH LEARNING FUNCTION AND SEMICONDUCTOR INTEGRATED CIRCUIT DEVICE INCLUDING THE SYNAPSE ELEMENT

(75) Inventor: Yutaka Arima, Iizuka (JP)

(73) Assignee: Exploitation of Next Generation Co. Ltd., Fukuoka (JP)

( * ) Notice: Subject to any disclaimer, the term of this patent is extended or adjusted under 35 U.S.C. 154(b) by 621 days.

(21) Appl. No.: 10/302,852

(22) Filed: Nov. 25, 2002

(65) Prior Publication Data

US 2003/0098476 A1    May 29, 2003

(30) Foreign Application Priority Data

Nov. 26, 2001   (JP)   ............... 2001-402112

(51) Int. Cl.
  *G06F 15/18*   (2006.01)
(52) U.S. Cl. ........................................ 706/33
(58) Field of Classification Search ................ 706/33, 706/26

See application file for complete search history.

(56) References Cited

U.S. PATENT DOCUMENTS

| | | | | |
|---|---|---|---|---|
| 4,868,629 A | * | 9/1989 | Eitan ............................ | 257/316 |
| 5,148,514 A | | 9/1992 | Arima et al. ................... | 706/34 |
| 5,204,549 A | * | 4/1993 | Platt et al. ..................... | 706/33 |
| 5,293,457 A | | 3/1994 | Arima et al. ................... | 706/34 |
| 5,336,936 A | * | 8/1994 | Allen et al. ............. | 365/185.03 |
| 5,347,613 A | * | 9/1994 | Chung et al. .................. | 706/33 |
| 5,442,209 A | * | 8/1995 | Chung .......................... | 257/270 |
| 5,745,655 A | * | 4/1998 | Chung et al. .................. | 706/33 |
| 5,939,945 A | * | 8/1999 | Thewes et al. ............. | 330/277 |
| 6,452,237 B1 | * | 9/2002 | Varshavsky ................ | 257/368 |
| 6,469,347 B1 | * | 10/2002 | Oda et al. .................... | 257/345 |
| 6,470,328 B1 | * | 10/2002 | Varshavsky .................. | 706/33 |
| 6,597,199 B1 | * | 7/2003 | Bui .............................. | 326/83 |

FOREIGN PATENT DOCUMENTS

JP          03-080379         4/1991
WO     WO 02/059979 A1     8/2002

OTHER PUBLICATIONS

"A Neuromorphic Microphone for Sound Localization", Chiang-Jung Pu, 1998, www.cnel.ufl.edu/bib/pdf_dissertation/pu_dissertation.pdf.*

"Hardware-Learning Neural Network LSI using a highly-functional transistor simulating neuron actions", Ishii, H.; Shibata, T.; Kosaka, H.; Ohmi, T.; Proceedings of 1993 International Joint Conference on Neural Networks.*

"A Neuron-MOS Neural Network using self-learning-compatible Synapse Circuits", Shibata, T.; Kosaka, H.; Ishii, H.; Ohmi, T.; IEEE Journal of Solid-State Circuits, vol. 30, No. 8, Aug. 1995.*

(Continued)

*Primary Examiner*—David Vincent
*Assistant Examiner*—Mai T. Tran
(74) *Attorney, Agent, or Firm*—Finnegan, Henderson, Farabow, Garrett & Dunner, L.L.P.

(57) ABSTRACT

A synapse configured of an A-MOS transistor has a learning function and can implement high integration similar to that of a DRAM because of its simplified circuit configuration and compact circuit size. With the presently cutting-edge technology (0.15 μm CMOS), approximately 1G synapses can be integrated on one chip. Accordingly, it is possible to implement a neural network with approximately 30,000 neurons all coupled together on one chip. This corresponds to a network scale capable of associatively storing approximately 5,000 patterns.

7 Claims, 10 Drawing Sheets

OTHER PUBLICATIONS

"Analog Velocity Sensing Circuits based on Bio-Inspired Correlation Neural Networks", Ohtani M.; Asai T.; Yonezu, H.;,Ohshima, N.; Microelectronics for Neural, Fuzzy and Bio-Inspired Syst, 1999. MicroNeuro Proc of the 7th Intl Conf on Apr. 7-9, 1999.*

Arima, Y. et al., "A Refreshable Analog VLSI Neural Network Chip with 400 Neurons and 40k Synapses", IEEE Journal of Solid-State Circuits, vol. 27, No. 12, pp. 1854-1861, Dec. 1992.

* cited by examiner

LOAD VALUE CORRECTION: $\Delta W_{ij} = -\eta\, S_i \times S_j$

LOAD VALUE CORRECTION: $\Delta W_{ij} = +\eta\, S_i \times S_j$

SYNAPSE ELEMENT WITH LEARNING FUNCTION AND SEMICONDUCTOR INTEGRATED CIRCUIT DEVICE INCLUDING THE SYNAPSE ELEMENT

BACKGROUND OF THE INVENTION

1. Field of the Invention

The present invention generally relates to a neural network associative memory LSI (Large Scale Integrated circuit). More particularly, the present invention relates to a synapse element with a learning function which can be highly integrated, and to a semiconductor integrated circuit device including the synapse element.

2. Description of the Background Art

Recently, research and development have been vigorously carried out on a brain-type computer based on the manner of processing information by the brain. Intuitive information processing such as pattern recognition, context association, combinatorial optimization or the like, which is easily carried out by the brain-type computer, is a technique indispensable for smooth communication between information processing machines and human beings. Such a technique is expected to make a breakthrough for the machines to be fitted into and utilized in the society without sense of discomfort. For the practical utilization of the brain-type computer, development of the dedicated hardware is indispensable. In particular, development of the neural network associative memory LSI as a main component of the brain-type computer is strongly required. For the practical utilization of the neural network associative memory LSI, the ultimate task is to realize the high integration of the synapse circuits with the learning functions required to store the associative patterns fast and freely. In the neural network forming the associative memory, a great number of synapses, approximately proportional to the square of the number of the neurons, are required. Accordingly, high integration of the synapses is most effective for the high integration of the associative memories. In addition, in order for the associative memory to be able to store the associative patterns fast and freely, the synapse needs to have the learning function.

As the prior art related to the associative memory neural network LSI with the learning function, a brief description will be made about the techniques disclosed in Japanese Patent Laying-Open No. 03-80379, and U.S. Pat. Nos. 5,148,514, and 5,293,457 (inventor: Yutaka Arima et al.). FIGS. 7A and 7B show exemplary block diagrams of the conventional neural network LSI. In each of FIGS. 7A and 7B, a line of neuron circuits is disposed in each of 4 sides of a chip, and the synapses are disposed and arranged, in a matrix, in almost all the other central regions of the chip. FIG. 7A illustrates two self-connected neural networks, while FIG. 7B shows one interconnected neural network. These arrangements and the interconnection interconnecting between a neuron circuit and a synapse circuit as illustrated in FIGS. 8A and 8B enable the neural network for the associative memory to be configured effectively.

FIG. 9 shows an example of the synapse circuit with the learning function. In a synapse circuit 100 illustrated in FIG. 9, a synapse load value (Wij) is represented by the amount of charges accumulated at a capacitor C1. The amount of charges accumulated at capacitor C1 is corrected in accordance with a learning law ($\Delta Wij = \pm \eta SiSj$, where $\eta$ is a learning coefficient, and is updated in accordance with the pulse number applied to ACP+ and ACP−) by a load correction circuit 101 made from a charge pump circuit, and a learning control circuit 102 applying a correction signal thereto. Si and Sj respectively correspond to the output signals of the neurons i and j applying signals to this synapse. In this prior art example, since a symmetrical synapse coupling (Wij=Wji) is expected, two synapse coupling operational circuits 103 are mounted to synapse circuit 100 producing one synapse load value.

FIG. 10 shows an example of the neuron circuit. In a neuron circuit 110 illustrated in FIG. 10, currents of the output signals from the synapse are added together at a common node 111 (Kirchhoff adder) to convert the signal to a voltage, and the voltage is compared with a threshold (Vref) of the neuron at a comparator 112. Two selectors 113 and 114 selectively output either the output of comparator 112 or an educator data SR (T) in a register 116, in accordance with an attribute data SR (P) in a register 115 within the present neuron circuit and a learning control signal IselS.

In accordance with the above-described prior art, synapse circuits with the learning functions can be packaged in a relatively high integration. In fact, it is reported that the integration of 80,000 synapses and 400 neurons on one chip has been successfully achieved by using a 0.8 μm CMOS technology (Y. Arima, et al. "A Refreshable Analog VLSI Neural Network Chip with 400 Neurons and 40 K Synapses," IEEE, Journal of Solid-State Circuits, vol. 27, No. 12, pp. 1854–1861, December, 1992.). Furthermore, by using this prior art technology together with the currently cutting-edge technology, which is a 0.15 μm-CMOS (Complementary Metal-Oxide Semiconductor), approximately 2 million synapses and approximately 2,000 neurons can be integrated on one chip. In this case, associative storage of approximately 300 patterns is possible. For the practical utilization, however, the storage capacity is not sufficient.

SUMMARY OF THE INVENTION

An object of the present invention is to provide a synapse element having a learning function and a simplified circuit configuration suitable for high integration required for a neuron associative memory, and a semiconductor integrated circuit device including the synapse element.

A synapse element in accordance with the present invention implements a function of a synapse composing a neuron of an element of a neural network, and includes an MOS transistor connected between an internal node and a first voltage and capable of modulating a gain coefficient in analog manner in accordance with a potential of a control gate. The MOS transistor receives at its gate an output signal of another neuron, the potential of the control gate corresponds to a synapse load value, and a source-drain current of the MOS transistor represents an output signal of the synapse element.

Preferably, the amount of charges accumulated in the control gate is adjusted by injection of either hot carriers or hot holes.

A semiconductor integrated circuit device in accordance with the present invention includes a synapse element implementing a function of a synapse composing a neuron of an element of a neural network, and the synapse element includes a first MOS transistor electrically coupled between an internal node and a first voltage and capable of modulating a gain coefficient in analog manner in accordance with a potential of a control gate. The first MOS transistor receives at its gate an output signal of another neuron, and the potential of the control gate corresponds to a synapse load value, and a source-drain current of the first MOS transistor represents an output signal of the synapse element.

Preferably, the semiconductor integrated circuit device includes a plurality of synapse elements connected in parallel between a common internal node and a first voltage, and further includes a capacitive element connected between the control gate of each of the plurality of synapse elements and a voltage node common to the plurality of synapse elements.

More preferably, the semiconductor integrated circuit device further includes a load value correction portion provided corresponding to the internal node, and the load value correction portion adjusts the amount of charges accumulated in the control gate of the first MOS transistor connected to the corresponding internal node by injection of either hot carriers or hot holes.

Even more preferably, the semiconductor integrated circuit device further includes a comparator producing an output signal of the neuron composed of the plurality of synapse elements based on the comparison between a voltage of the internal node and the prescribed threshold voltage, a delay circuit delaying the output of the comparator for a prescribed period of time before output, a second MOS transistor receiving the output of the delay circuit at its gate and electrically coupled between the internal node and a second voltage, and a third MOS transistor electrically coupled between the second voltage and the internal node and having the gate connected to the internal node.

Thus, a great advantage of the present invention is that it provides a synapse element with a learning function, capable of realizing high integration of a DRAM (Dynamic Random Access Memory), because of its simplified circuit configuration and compact circuit size.

With the presently cutting-edge technology (0.15 μm-CMOS), approximately 1 G ($1 \times 10^9$) synapse elements of the present invention can be integrated on one chip. Accordingly, it is possible to implement a full-connected neural network with approximately 30,000 on one chip of the semiconductor integrated circuit device. This corresponds to a network scale capable of associatively storing approximately 5,000 patterns. Therefore, this can contribute to the realization of the practical utilization of the associative memory LSI being capable of storing thousands of patterns or more, which has been difficult to achieve with the conventional technique.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
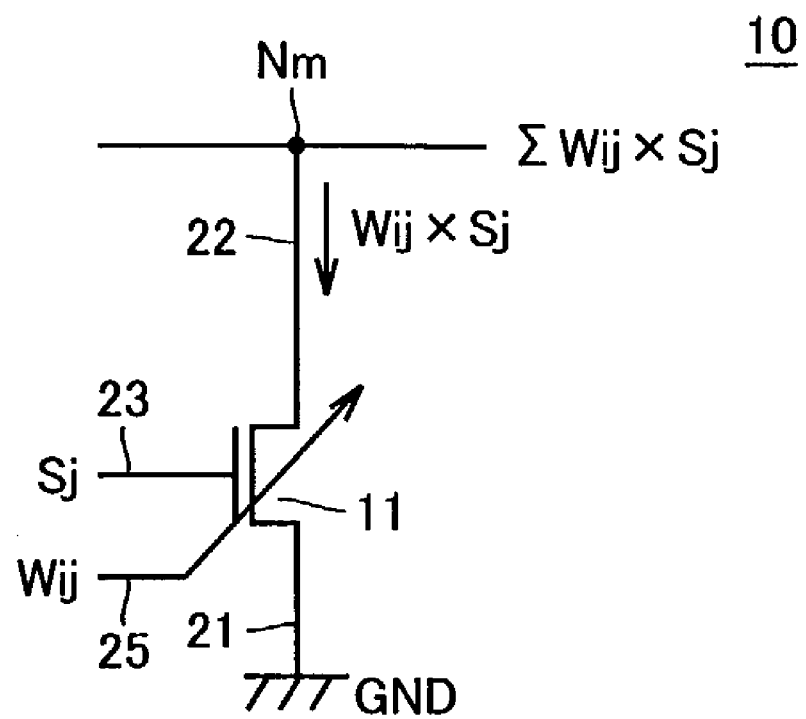
FIG. 1 shows an example block of a basic circuit configuration diagram of an element utilizing an A-MOS in a synapse circuit of the present invention.

With reference to FIG. 1, a synapse circuit 10 in accordance with the present invention is configured of an A-MOS (Adjustable β-MOS) transistor 11 provided between a common node Nm and a ground voltage GND. As will be described in detail in the following, the present invention is characterized in that the A-MOS device is applied to the synapse circuit composing a neural network.

The configuration and characteristic of the A-MOS transistor will simply be described hereinafter. Note that the A-MOS transistor is specifically disclosed in pamphlet of International Publication No. WO02/059979A1.

Figure 11:
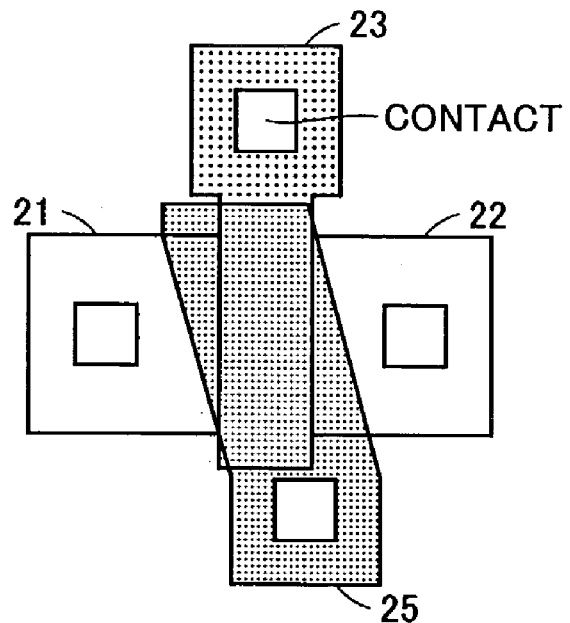
FIG. 11 shows an example of a diagram representing a configuration of an A-MOS device.

With reference to FIG. 11, the A-MOS transistor has source 21, drain 22 and gate 23 (hereinafter also referred to as a "normal MOS gate"), as in a typical MOS transistor, and in addition thereto the A-MOS transistor further has a control gate 25. Source 21, drain 22, normal MOS gate 23 and control gate 25 are each provided with a contact, as appropriate. In the A-MOS transistor, a gain coefficient β is modulated in analog manner in accordance with a voltage applied to control gate 25.

Figure 12:
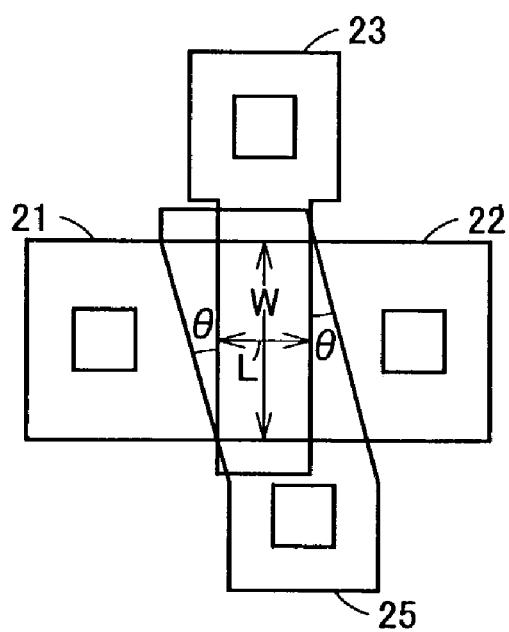
FIG. 12 shows an example of the configuration parameter of the A-MOS device.

In the A-MOS transistor, a gain coefficient β modulation characteristic is determined by device geometry parameters shown in FIG. 12, more specifically, gate length L and width W of normal MOS gate 23 and an angle θ formed by normal MOS gate 23 and control gate 25. In other words, by designing these parameters, a ratio between a minimal β and a maximum β can be set relatively freely.

Figure 13A:
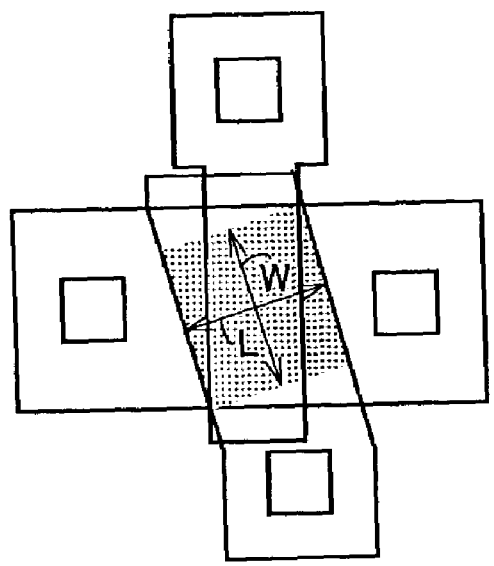
FIGS. 13A and 13B show examples of β modulation of the A-MOS.
Figure 13B:
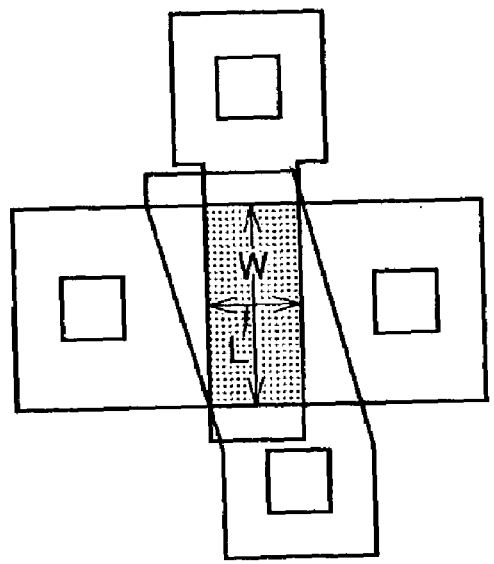

FIGS. 13A and 13B show a principle of β modulation in the A-MOS transistor. FIG. 13A shows that a conductance of a channel of control gate 25 is set to be equivalent to that of normal MOS gate 23. In the figure, the hatched portion indicates an effective gate region.

By contrast, FIG. 13B shows that the conductance of the channel of control gate 25 is set to be sufficiently larger than that of normal MOS gate 23, with the hatched portion indicating an effective gate region.

Thus in the A-MOS transistor a voltage applied to control gate 25 can be changed to control a direction of an electric field in a channel region to modulate effective gate length L# and width W# in analog manner. Consequently, in accordance with the control gate voltage the gain coefficient β can be modulated in analog manner.

In the A-MOS transistor, a source-drain current Isd is expressed by the following equation (1) with a normal gate voltage Vg and a control gate voltage Vcg.

$$Isd \propto Vg^2 \times Vcg^{1-2} \qquad (1)$$

Thus, by providing a load with a diode characteristic to the drain side of the A-MOS transistor, an approximation of the product of normal gate voltage Vg and control gate voltage Vcg can be output. In addition, by connecting the drains of a plurality of A-MOS transistors with a common node to add together the source-drain currents of these A-MOS transistors, a product-sum operation can be expressed.

Referring back to FIG. 1, an output signal Sj from another neuron is connected to normal gate 23 of A-MOS transistor 11, and control gate 25 is floated. A synapse load value Wij is represented by the accumulated charges of control gate 25. As a result, source-drain current Isd flowing through A-MOS transistor 11 changes in accordance with the product of output signal Sj of a neuron and synapse load value Wij.

Figure 2:
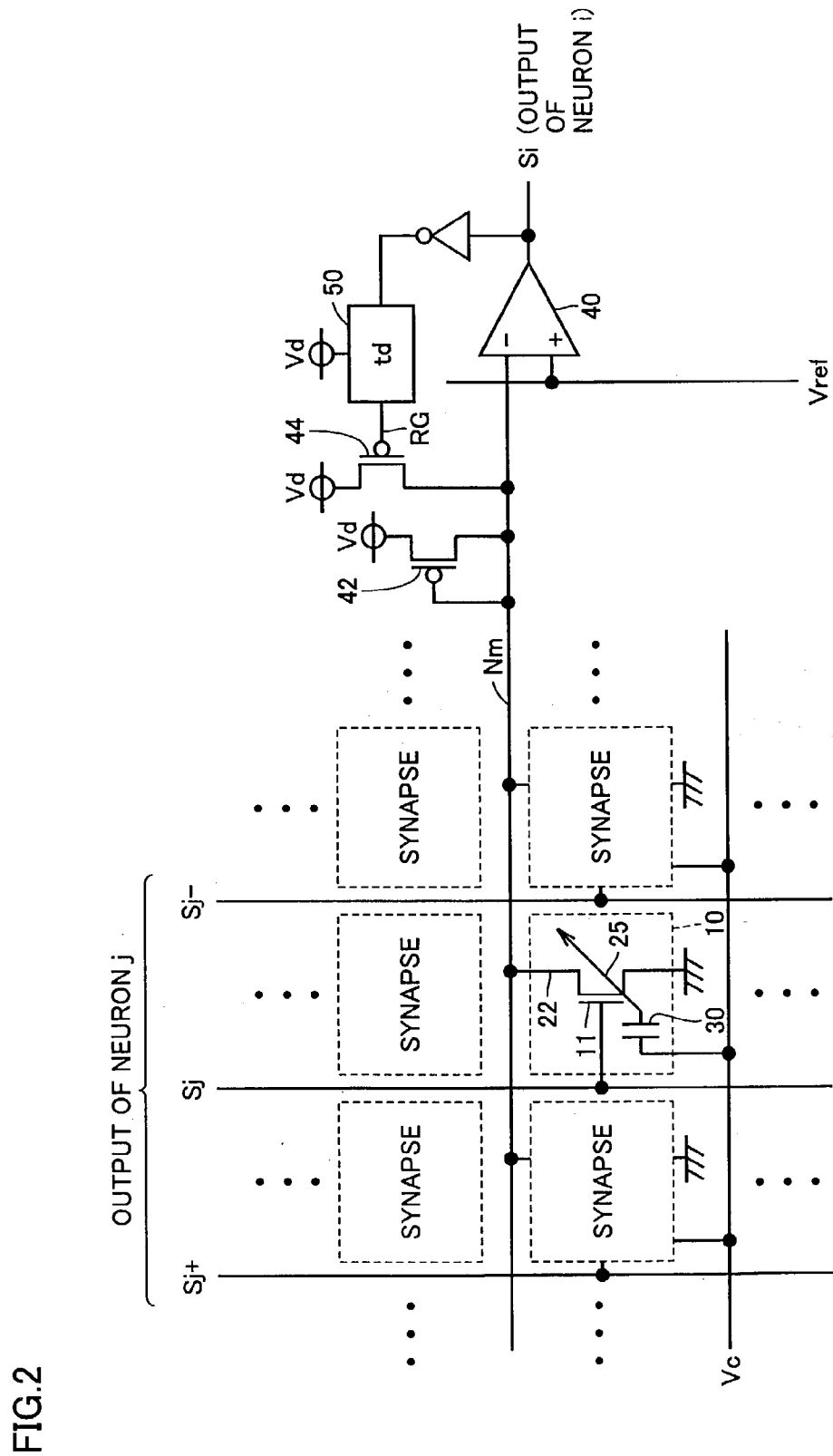
FIG. 2 shows an example of a circuit configuration utilizing the AMOS in the synapse circuit of the present invention.

As shown in FIG. 2, control gate 25 of A-MOS transistor 11 is floated, and is capacitively coupled to a node supplying a learning control voltage Vc with a capacitor 30 posed therebetween. Furthermore, the neural network may have a circuit configuration in which drain nodes 22 of a plurality of A-MOS transistors 11 are connected together through a common node Nm to make common node Nm serve as an axon signal line so that the sum of their currents is regarded as an input signal to the neuron.

A threshold voltage Vref and a voltage produced at a p-MOS transistor 42 connected to common node Nm are applied to a comparator 40, shown in FIG. 2, which determines and outputs the output signal of the neuron. In addition, the drain of p-MOS transistor 44 is connected to common node Nm. Because of the configuration in which an inverted delay signal (with a delay time td produced by delay circuit 50) of neuron signal Si is applied to the gate of p-MOS transistor 44, the neuron signal is turned ON, after a certain period of delay time, p-MOS transistor 44 is turned ON, and the potential of common node Nm increases. Consequently, the output of the neuron is forced to be OFF.

After a certain period of delay time subsequent thereto, p-MOS transistor 44 is turned OFF. After a time period corresponding to the drivability of synapse circuit 10 of the present invention (which may be referred to as "AMOS synapse" hereinafter) configured of an A-MOS and connected to common node Nm, an output of a neuron i is again made ON, and the series of operations are repeated. In other words, frequency of pulse generation of an output signal of a neuron is modulated in accordance with the total sum of currents flowing through common node Nm.

Figure 3:
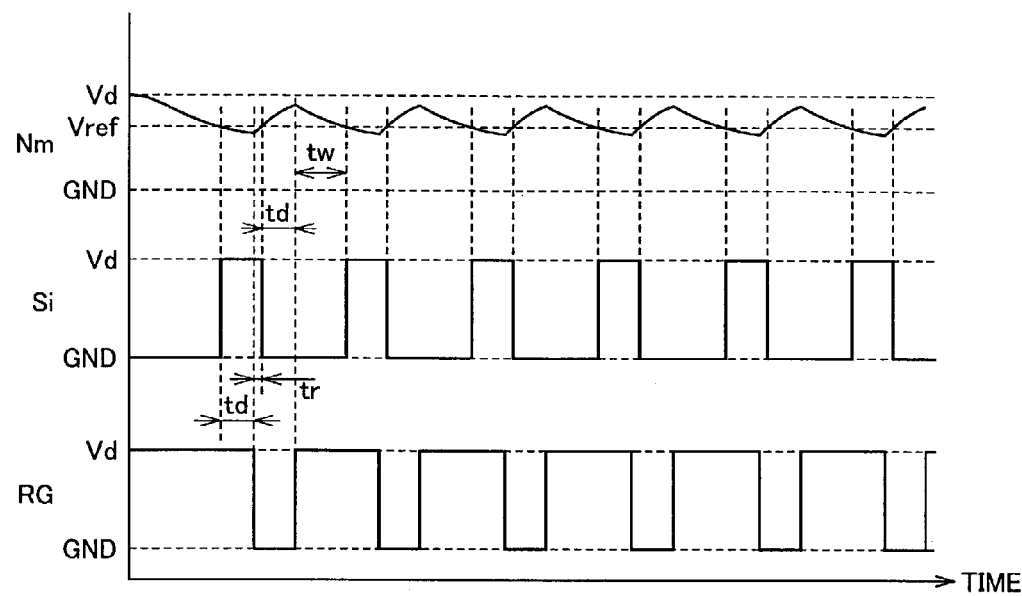
FIG. 3 is a diagram representing an example of the behavior of the various types of signals in FIG. 2.

FIG. 3 shows an example of the behavior of the various types of signals related to the signal output of the neuron. A pulse signal period T of output signal Si of the neuron is given by the following equation (2):

$$T=2td+tr+tw \quad (2)$$

where tr corresponds to a delay time produced when p-MOS transistor 44 transmits a signal to common node Nm, and tw corresponds to a delay time produced when the entire synapses transmit signals to common node Nm. Thus, as the total signals from the synapses increase (as the currents increase), tw becomes smaller and pulse signal period T also becomes shorter. Accordingly, frequency of generation of the output pulse signal of the neuron increases as the total signals from the synapses increase.

Figure 4:
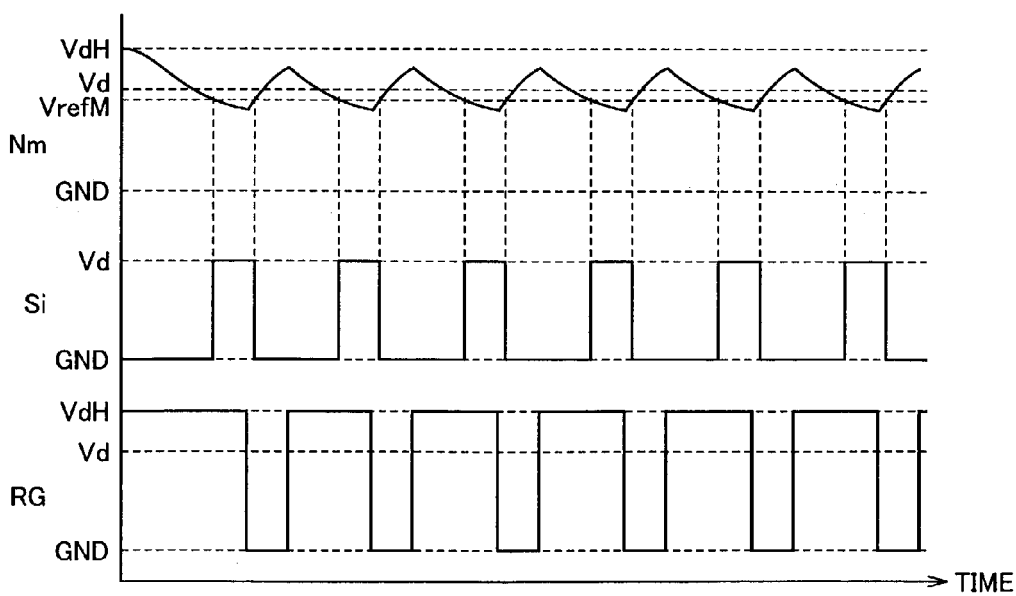
FIG. 4 is a diagram representing an example of the states of the various types of signals in learning.

FIG. 4 shows the states of various types of signals during neural network learning period for storing associative patterns, i.e. when a synapse load value is corrected. A correction to a synapse load value corresponds to a correction to the amount of charges accumulated in control gate 25 of each A-MOS synapse 10. In order to correct the amount of charges accumulated in control gate 25, learning control voltage Vc and a power-supply voltage for P-MOS transistor 44 and delay circuit 50 are controlled as appropriate so that the amount of charges accumulated in the control gate can be corrected in accordance with the learning law ($\Delta Wij=\pm\eta SiSj$).

Figure 5:
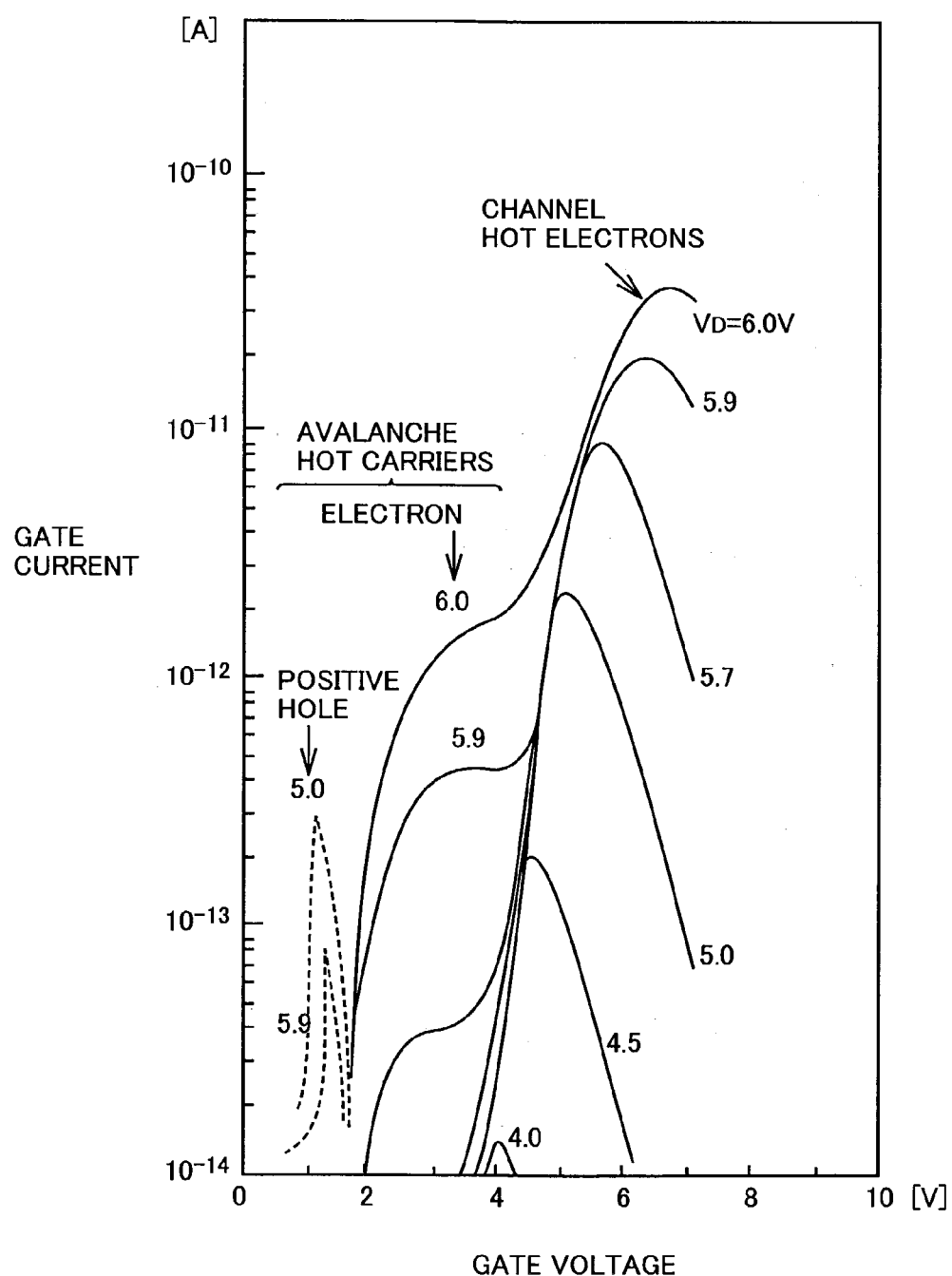
FIG. 5 is a graph showing an example of hot electron injection characteristic.

In learning, the power-supply voltage is set at VdH sufficiently higher than Vd. This enables injection of hot carriers near the drain of the A-MOS transistor. At this time, threshold voltage of comparator 40 is also changed to VrefM in accordance with learning control voltage Vc. When Hebb learning law ($\Delta Wij=\pm\eta SiSj$) is to be implemented, learning control voltage Vc is driven to "Low" (~GND). This shifts the potential of control gate 25 to a lower value. As is apparent from the exemplary characteristic of hot carrier injection in FIG. 5, this makes injection of holes by avalanche predominant, and the synapse load value increases only when both Si and Sj are ON.

Meanwhile, when anti-Hebb learning law ($\Delta Wij=-\eta SiSj$) is to be implemented, control voltage Vc is driven to "High" (~VdH) to shift the potential of the control gate to a higher value so that injection of channel hot electrons becomes predominant and the synapse load value can be decreased only when both Si and Sj are ON.

Figure 6A:
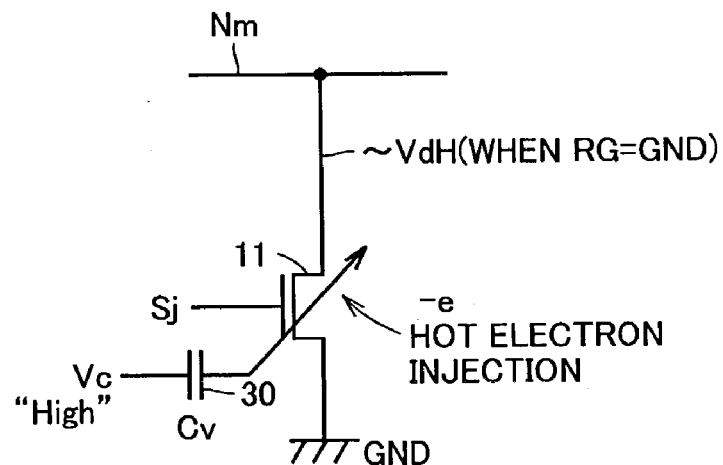
FIGS. 6A and 6B are circuit diagrams representing the operations of correcting synapse load values in learning.
Figure 6B:
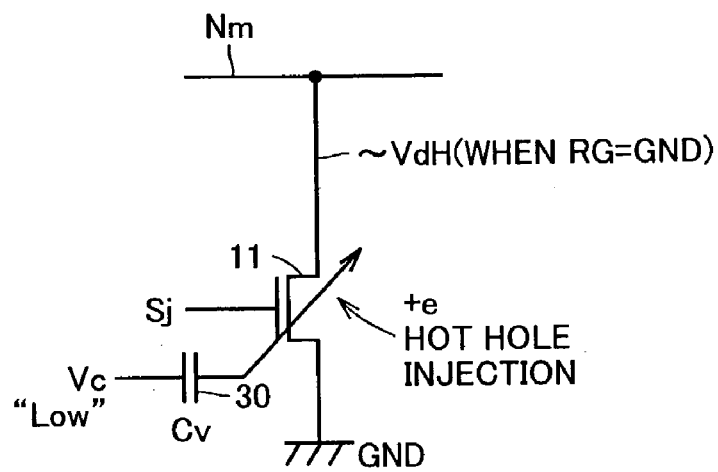
Figure 7A:
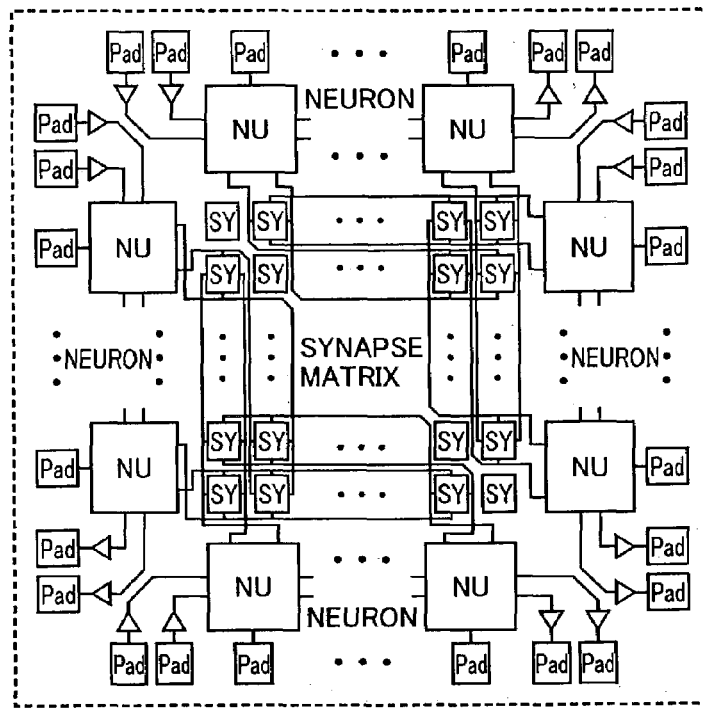
FIGS. 7A and 7B are block diagrams showing the configurations of the conventional neural network LSI.
Figure 7B:
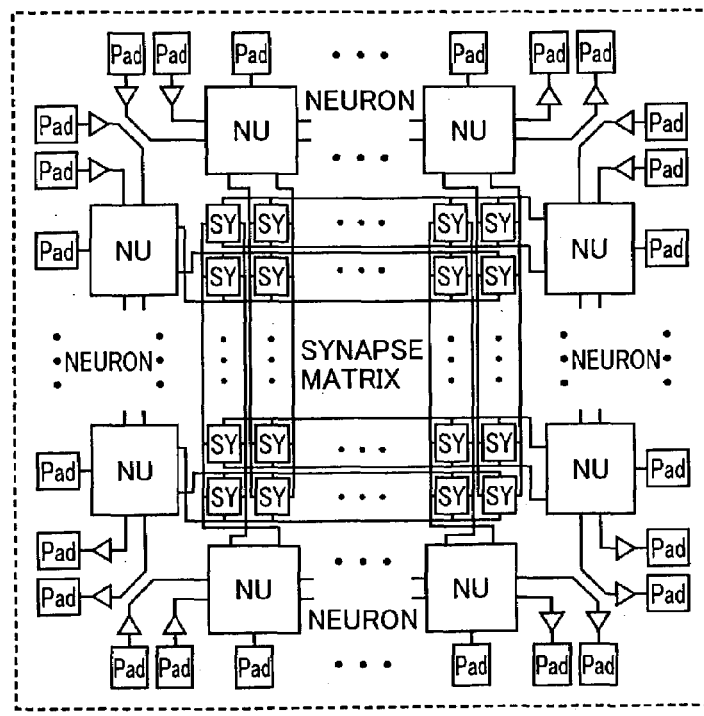
Figure 8A:
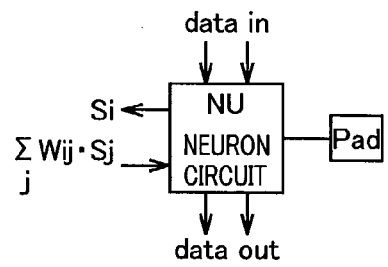
FIGS. 8A and 8B are schematic diagrams representing the relations of the interconnections of a neuron circuit and a synapse circuit respectively.
Figure 8B:
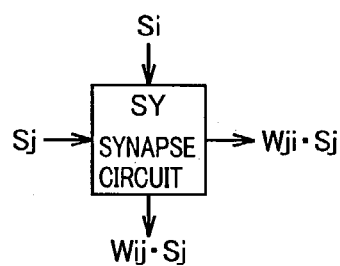
Figure 9:
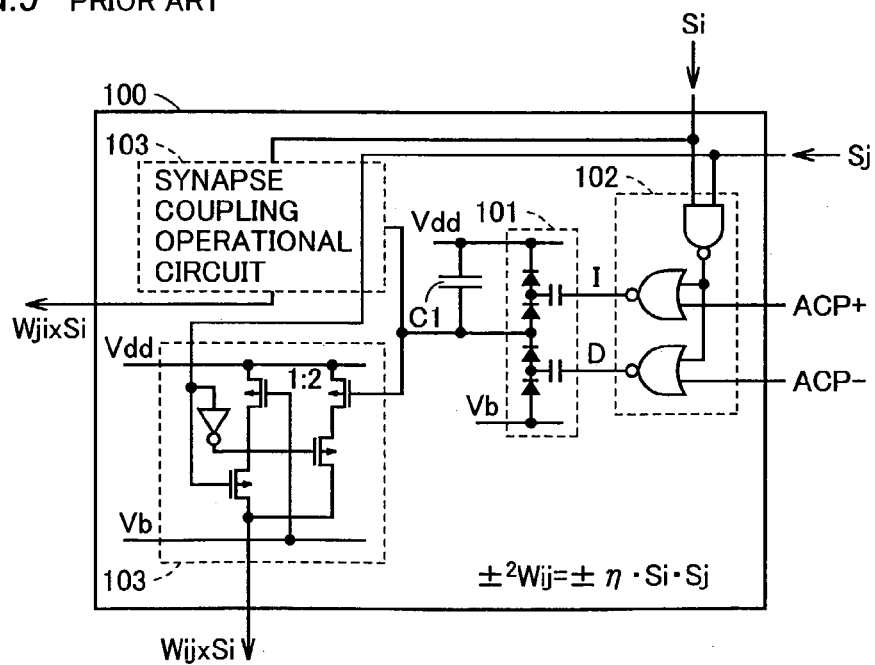
FIG. 9 is a diagram showing a configuration of the conventional synapse circuit.
Figure 10:
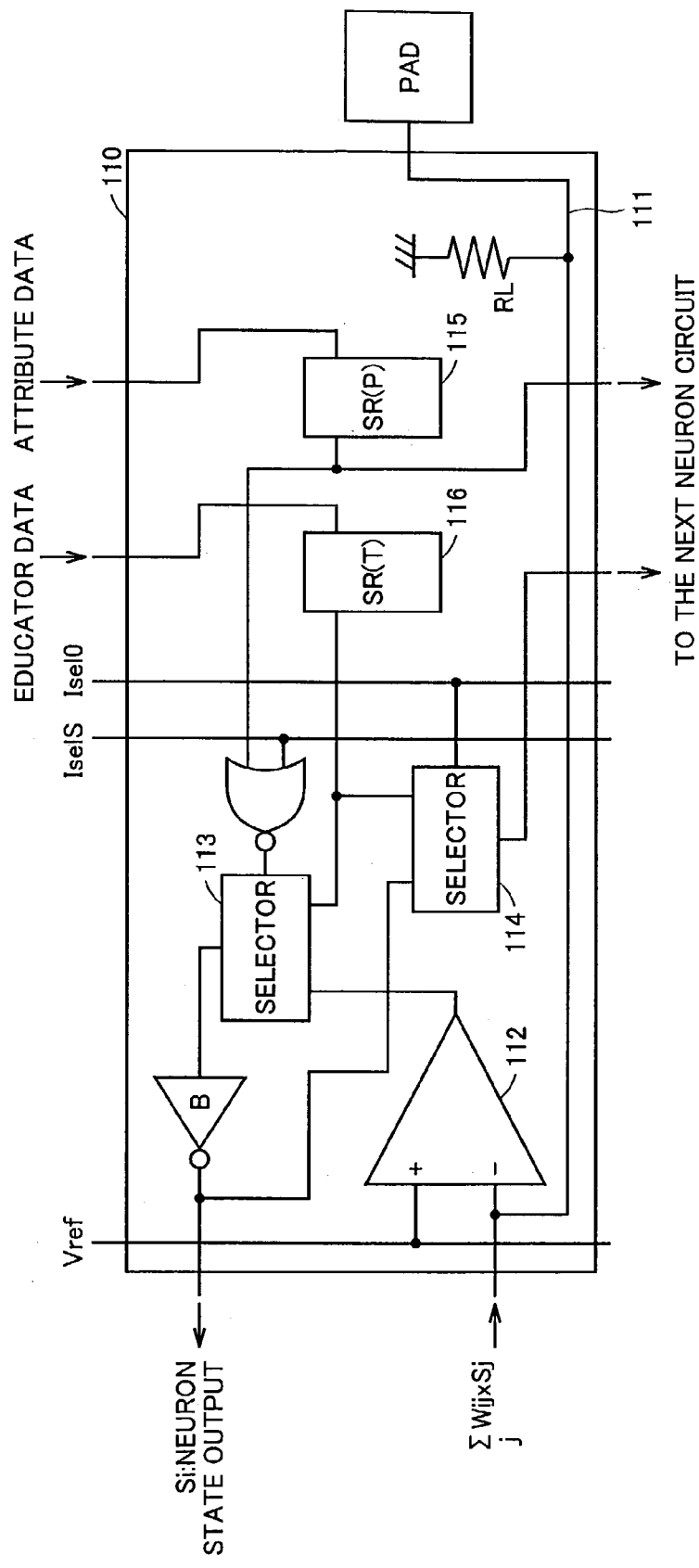
FIG. 10 is a diagram showing a configuration of the conventional neuron circuit.

FIGS. 6A and 6B show the states of the potentials at synapse elements when the learning laws are implemented. FIG. 6A shows a state in which a synapse load value is corrected to a value with the negative sign ($\Delta Wij=-\eta Si\times Sj$) by injection of hot electrons, while FIG. 6B represents a state in which a synapse load value is corrected to a value with the positive sign ($\Delta Wij=+\eta Si\times Sj$) by injection of hot holes.

As described above, the present invention is characterized in that the A-MOS transistor is utilized for the synapse circuit composing the neural network. In the circuit configuration in accordance with the present invention, the synapse load value is represented by the potential of the A-MOS control gate. The β variable characteristic of the A-MOS transistor implements the product of the synapse load value (the control gate voltage) and the neuron signal (the input gate voltage). The A-MOS control gate is floated, and the adjustment of the learning control voltage capacitively coupled thereto enables the correction of the synapse load value by injection of hot electrons to attain the learning function.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synapse element implementing a function of a synapse composing a neuron of an element of a neural network, comprising:

an A-MOS transistor connected between an internal node and a first voltage and capable of modulating a gain coefficient in analog manner in accordance with a potential of a control gate; wherein said A-MOS transistor receives at its gate an output signal of another said neuron, potential of said control gate corresponding to a synapse load value, wherein the synapse load value may be modified by adjusting a control voltage capacitively coupled to said control gate, and source-drain current of said A-MOS transistor represents an output signal of said synapse element.

2. The synapse element according to claim 1, wherein amount of charges accumulated in said control gate is adjusted by injection of hot carriers or hot holes.

3. A semiconductor integrated circuit device comprising:
a synapse element implementing a function of a synapse composing a neuron of an element of a neural network; wherein
said synapse element includes a first A-MOS transistor electrically coupled between an internal node and a first voltage and capable of modulating a gain coefficient in analog manner in accordance with a potential of a control gate,
said first A-MOS transistor receives at its gate an output signal of another said neuron,
potential of said control gate corresponds to a synapse load value,
wherein the synapse load value may be modified by adjusting a control voltage capacitively coupled to said control gate, and
source-drain current of said first A-MOS transistor represents an output signal of said synapse element.

4. The semiconductor integrated circuit device according to claim 3, further comprising:
a plurality of said synapse elements commonly sharing said internal node and connected in parallel between said internal node and said first voltage; and
a capacitive element connected between said control gate of each of said plurality of synapse elements and a voltage node common to said plurality of synapse elements.

5. The semiconductor integrated circuit device according to claim 4, further comprising:
a load value correction portion provided corresponding to said internal node; wherein
said load value correction portion adjusts amount of charges accumulated in said control gate of said first A-MOS transistor connected to corresponding said internal node by injection of hot carriers or hot holes.

6. The semiconductor integrated circuit device according to claim 4, further comprising:
a comparator producing an output signal of the neuron composed of said plurality of synapse elements based on comparison between a voltage of said internal node and a prescribed threshold voltage;
a delay circuit delaying an output of said comparator for a prescribed period of time before output;
a second MOS transistor receiving the output of said delay circuit at its gate and electrically coupled between said internal node and a second voltage; and
a third MOS transistor electrically coupled between said second voltage and said internal node and having its gate connected to said internal node.

7. A synapse element implementing a function of a synapse composing a neuron of an element of a neural network, comprising:
an A-MOS transistor connected between an internal node and a first voltage and capable of modulating a gain coefficient in analog manner in accordance with a potential of a control gate; wherein
said A-MOS transistor receives at its gate an output signal of another said neuron, potential of said control gate corresponding to a synapse load value,
said control gate of said A-MOS transistor is electrically coupled to a voltage node common to a plurality of synapse elements via a capacitive element, wherein the synapse load value is based on a potential associated with the voltage node; and
source-drain current of said A-MOS transistor represents an output signal of said synapse element.

* * * * *